(12) United States Patent
Matsumoto

(10) Patent No.: US 6,399,449 B1
(45) Date of Patent: Jun. 4, 2002

(54) SEMICONDUCTOR CIRCUIT USING TRENCH ISOLATION AND METHOD OF FABRICATION A TRENCH ISOLATOR

(75) Inventor: Naoya Matsumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/425,642

(22) Filed: Oct. 22, 1999

Related U.S. Application Data

(62) Division of application No. 08/909,264, filed on Aug. 11, 1997, now abandoned.

(30) Foreign Application Priority Data

Aug. 9, 1996 (JP) ............................................. 8-227783

(51) Int. Cl.$^7$ ........................ H01L 21/336; H01L 21/76
(52) U.S. Cl. ..................... 438/296; 438/404; 438/427; 438/436
(58) Field of Search ................................ 438/296, 404, 438/427, 436

(56) References Cited

U.S. PATENT DOCUMENTS

| | | | |
|---|---|---|---|
| 4,472,240 A | * | 9/1984 | Kameyama |
| 4,579,812 A | * | 4/1986 | Bower |
| 5,411,913 A | * | 5/1995 | Bashir et al. |
| 5,536,675 A | * | 7/1996 | Bohr |
| 5,895,253 A | * | 4/1999 | Akram |
| 5,904,540 A | * | 5/1999 | Sheng et al. |

FOREIGN PATENT DOCUMENTS

| | | |
|---|---|---|
| JP | 5-114646 | 5/1993 |
| JP | 5-267445 | 10/1993 |
| JP | 5-315439 | 11/1993 |
| JP | 5-315442 | 11/1993 |

OTHER PUBLICATIONS

Japanese Office Action dated Aug. 1, 2000 and cited references: (1) Kokai No. 6–31066, (2) Kokai No. 4–48647 and (3) Kokai No. 2–90670 together with English language translation of wavy lined material.
108367 Japanese Patent Office Action.

* cited by examiner

*Primary Examiner*—John F. Niebling
*Assistant Examiner*—Josetta I. Jones
(74) *Attorney, Agent, or Firm*—Michael Best & Friedrich LLC; Laff, Whitesel & Saret, Ltd.; J. Warren Whitesel

(57) ABSTRACT

In order to isolate a plurality of MOS and bipolar devices provided on the same chip, a plurality of first and second trenches are provided on a semiconductor substrate. Each of the first trenches is filled with silicon oxide containing no impurity and is used to isolate the MOS devices. On the other hand, the second trenches are formed within the first trenches. Each second trench is filled silicon oxide containing phosphorous and boron and is used to isolate the bipolar devices. The inner surface of each second trench is coated with a silicon nitride film for preventing boron (or phosphorous) from being diffused into the surrounding region.

2 Claims, 4 Drawing Sheets

SEMICONDUCTOR CIRCUIT USING TRENCH ISOLATION AND METHOD OF FABRICATION A TRENCH ISOLATOR

This is a division of Ser. No. 08/909,264, filed Aug. 11, 1997, now abandoned.

BACKGROUND OF THE INVENTION

1. Field of the Invention

The present invention relates generally to a semiconductor integrated circuit (IC) wherein devices are segregated using trench isolation techniques, and more specifically to a semiconductor device wherein a deep trench is formed in a shallow trench. Still more specifically, the present invention relates to a method of fabricating a trench isolator wherein a deep trench is provided in a shallow trench.

2. Description of the Related Art

BIMOS (or BiCMOS) is a technology that integrates both MOS (metal-oxide-semiconductor) and bipolar device structures on the same chip, and thus offering the benefits of both MOS and bipolar circuits. It is known in that art that shallow and deep trenches are respectively used to isolate MOS and bipolar devices. Each of deep trenches is formed in a shallow trench in order to meet a current tendency of achieving higher packaging of device.

Before turning to the present invention it is deemed advantageous to briefly describe, with reference to FIGS. 1A–1D and 2, a conventional technique of trench isolation using shallow and deep trenches for segregating active regions. This conventional technique is disclosed in Japanese Laid-open Patent Application No 5-315439.

FIGS. 1A–1D are diagrams showing a series of fabrication processes of shallow and deep trenches, which are used to respectively isolate CMOS and bipolar devices (not shown). It is to be noted that each of FIGS. 1A–1D shows only three shallow trenches (one is shown in part) 10a–10c and only one deep trench 14 are illustrated for the sake of simplifying the illustration.

Referring to FIG. 1A, the process begins with a plurality of shallow trenches 10a–10c being formed on a silicon substrate 12. After this, a deep trench 14 is formed within the shallow trench 10b in this particular case. The entire surface of the silicon substrate 12 is then covered with a BPSG (boro-phospho-silicate glass) film 16 using a CVD (chemical vapor deposition) technique. The BPSG film 16 is advantageous in that it has a coefficient of thermal expansion that is similar to that of the silicon substrate 12. In addition, the BPSG film 16 is easily flattened by way of a reflow process.

As shown in FIG. 1B, the BPSG film 16 is etched back so as to leave the BPSB film 16 in both the shallow trenches 10a–10c and the deep trench 14. The surface of the BPSG film 16 in the trenches is flattened using a reflow process at temperature between 900° C. and 1000° C. for 30 to 60 minutes. Subsequently, as shown in FIG. 1C, a silicon oxide (SiO$_2$) film 18 is deposited over the entire surface of the structure shown in FIG. 1B. Thereafter, the silicon oxide film 18 is polished until the structure shown in FIG. 1D is obtained. Thus, the BPSG film 16 is effectively capped with the silicon oxide film 18.

The aforesaid conventional technique, however, has suffered from the following drawbacks.

As mentioned above, the shallow trench is used to isolate MOS devices (transistors). A first drawback is described with reference to FIG. 2. As shown in FIG. 2, the source, drain and gate regions 20, 22 and 24 of a MOS transistor are provided in the immediate vicinity of the shallow trench 26. Thus, boron (or phosphorus) contained in the BPSG film 16 (FIG. 1) is liable to diffuse into these regions 20, 22 and 24 during thermal treatments for fabricating the transistors. That is to say, the diffusion of boron (or phosphorous) develops diffused regions, each of which exhibits a concentration of impurity equal to or more than that of a well. The concentration of each of the diffused layers depends on the volume of the associated shallow trench. Therefore, the diffused layers may exhibit different impurity concentrations with different locations on the substrate. Especially, the differences of diffused impurity concentrations under the gates, undesirably lead to the differences of threshold voltages with different devices.

On the other hand, the deep trench is used to isolate bipolar transistors. The BPSG film is filled in a deep trench and thus causes the following problem. For example, when an NPN transistor is fabricated, a N-type collector region and N-type buried layer are provided vertically and surrounded by the deep trench. In this case, since the concentration of boron in the BPSG film is higher than that of phosphorous, a P-type diffused layer is formed around the deep trench. As a result, parasitic capacitance is developed between the P-type diffused layer and the N-type collector region and between the P-type diffused layer and the N-type buried layer. This parasitic capacitance adversely affects the high-speed operations of the bipolar transistors. It is therefore highly desirable to suppress the formation of the parasitic capacitance.

Still further, as mentioned above, after the BPSG film 16 is removed (FIGS. 1A and 1B), the silicon oxide film 18 is removed (FIGS. 1C and 1D). That is, two times of film removal are necessary with the conventional technique. It is known in the art that the film removal is implemented frequently monitoring the thickness of the film on the substrate and accordingly, it is very difficult to automate such a process. Therefore, it is quite preferable if the number of times of removing the film is reduced to once.

SUMMARY OF THE INVENTION

It is therefore an object of the present to provide a technique that is able to markedly reduce the variations of threshold voltages of MOS transistors and the parasitic capacitance of bipolar transistors, which have been described in the above.

In brief, these objects are achieved by a technique wherein in order to isolate a plurality of MOS and bipolar devices provided on the same chip, a plurality of first and second trenches are provided on a semiconductor substrate. Each of the first trenches is filled with silicon oxide containing no impurity and is used to isolate the MOS devices. On the other hand, the second trenches are formed within the first trenches. Each second trench is filled silicon oxide containing phosphorous and boron and is used to isolate the bipolar devices. The inner surface of each second trench is coated with a silicon nitride film for preventing boron (or phosphorus) from being diffused into the surrounding region.

One aspect of the present invention resides in a semiconductor circuit comprising: a plurality of first trenches each of which is formed on a semiconductor substrate and is filled with a first dielectric film; and a plurality of second trenches each of which is formed in the first trench and filled with a second dielectric film.

Another aspect of the present invention resides in a semiconductor circuit comprising: a plurality of first trenches each of which is formed on a semiconductor substrate and is filled with first silicon oxide containing no impurity; and a plurality of second trenches each of which is formed in the first trench and filled with second silicon oxide containing phosphorous and boron.

Another aspect of the present invention resides in a semiconductor circuit comprising: a plurality of first trenches each of which is filled with first silicon oxide containing no impurity; a plurality of second trenches each of which is formed in the first trench and filled with second silicon oxide containing phosphorous and boron; and a barrier layer for preventing diffusion of phosphorous and boron from the second silicon oxide, the barrier layer being provided on an inner surface of each of the second trenches.

Still another object of the present invention resides in a semiconductor circuit comprising a plurality of MOS and bipolar devices on the same chip, the semiconductor circuit comprising: a plurality of first trenches each of which is formed on a semiconductor substrate and is filled with first silicon oxide containing no impurity, the first trenches being used to isolate the MOS devices; and a plurality of second trenches each of which is formed in the first trench and filled with second silicon oxide containing phosphorous and boron, the second trenches being used to isolate the bipolar devices.

Still another object of the present invention resides in a method of forming a device isolating means on the surface of a semiconductor substrate, comprising the steps of: (a) forming a plurality of first trenches on the semiconductor substrate; (b) depositing a first dielectric film over the semiconductor substrate and in each of the first trenches; (c) forming a plurality of second trenches within corresponding first trenches through the first dielectric film; (d) depositing a second dielectric film over the surface of the first dielectric film and in each of the second trenches; (e) reflowing the second dielectric film; and (f) removing the first and second dielectric films while leaving the first and second dielectric films within the first and second trenches, respectively.

Still another object of the present invention resides in a method of forming a device isolating means on the surface of a semiconductor circuit, comprising the steps of: (a) forming a plurality of first trenches (40a–40c) on the semiconductor substrate; (b) depositing a first dielectric film (44) over the semiconductor substrate and in each of the first trenches; (c) forming a plurality of second trenches (46) within corresponding first trenches through the first dielectric film; (d) depositing a second dielectric film (48) over the first dielectric film and on an inner surface of each of the second trenches; (e) depositing a third dielectric film (50) over the second dielectric film and in each of the second trenches; (f) reflowing the third dielectric film; and (g) removing the first, second and third dielectric films while leaving the first dielectric film in the first trenches and leaving the second and third dielectric films within the second trenches.

BRIEF DESCRIPTION OF THE DRAWINGS

The features and advantages of the present invention will become more clearly appreciated from the following description taken in conjunction with the accompanying drawings in which like elements are denoted by like reference numerals and in which.

DETAILED DESCRIPTION OF THE PREFERRED EMBODIMENTS

A first embodiment of the present invention will be described with reference to FIGS. 3A–3C, which show a series of fabrication processes of shallow and deep trenches. As mentioned above, the shallow and deep trenches are used to respectively isolate CMOS and bipolar devices (not shown).

Figure 1A:
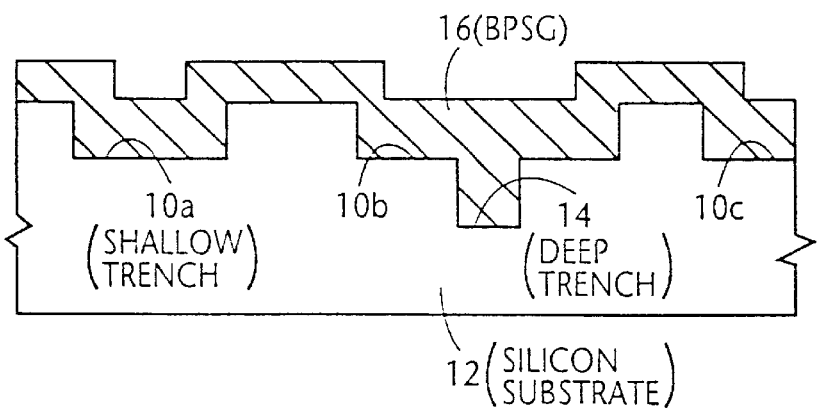
FIGS. 1A through 1D is a schematic cross-sectional representation of a conventional technique for forming devise segregating regions using shallow and deep trenches, being referred to in the opening paragraphs.
Figure 1B:
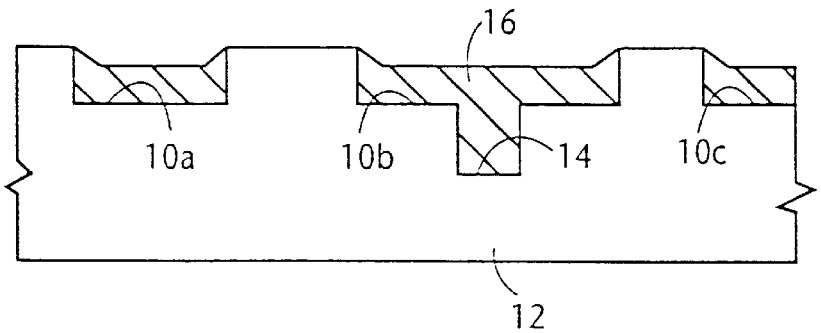
Figure 1C:
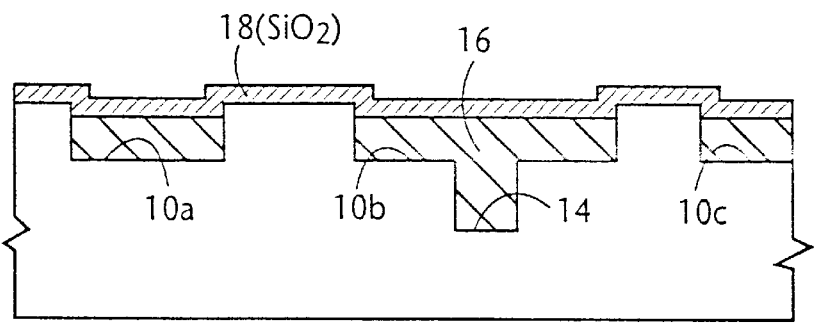
Figure 1D:
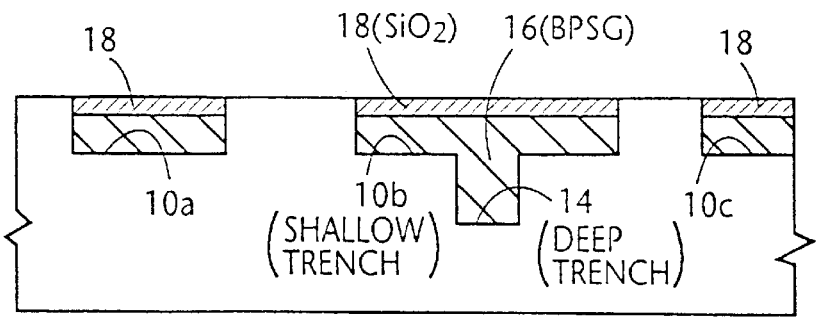
Figure 2:
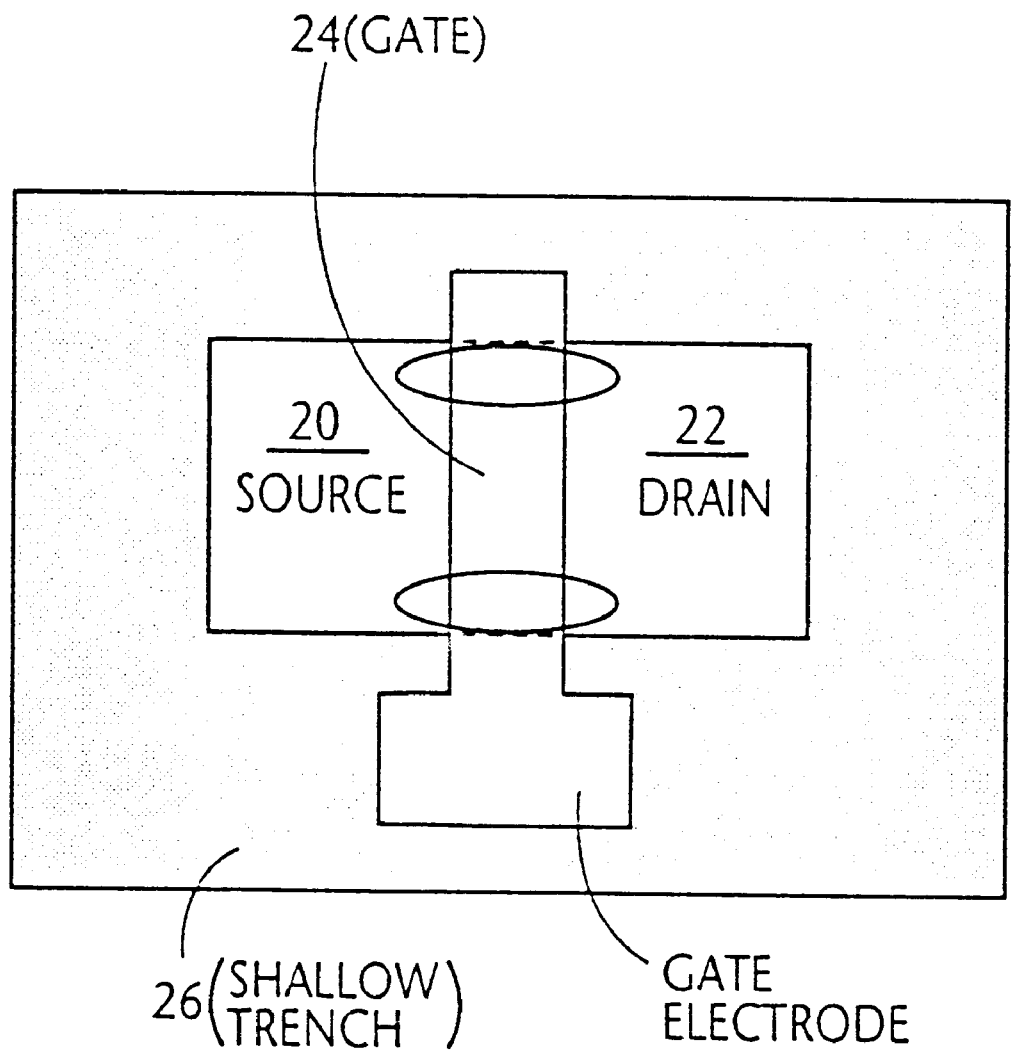
FIG. 2 is a plan view of a MOS structure enclosed by a shallow trench for discussing a drawback inherent in the technique referred to in FIGS. 1A–1D.
Figure 3A:
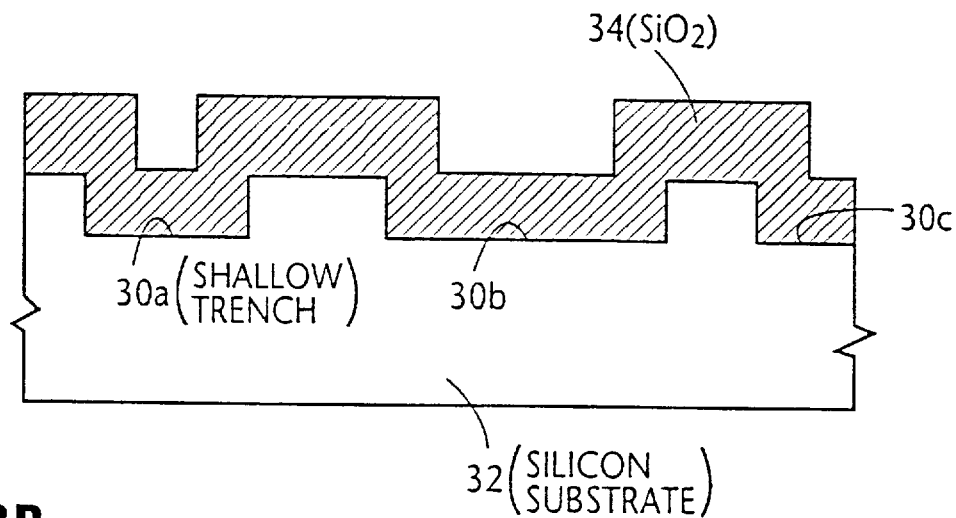
FIGS. 3A through 3C is a schematic cross-section representation of a first embodiment of the present invention.
Figure 3B:
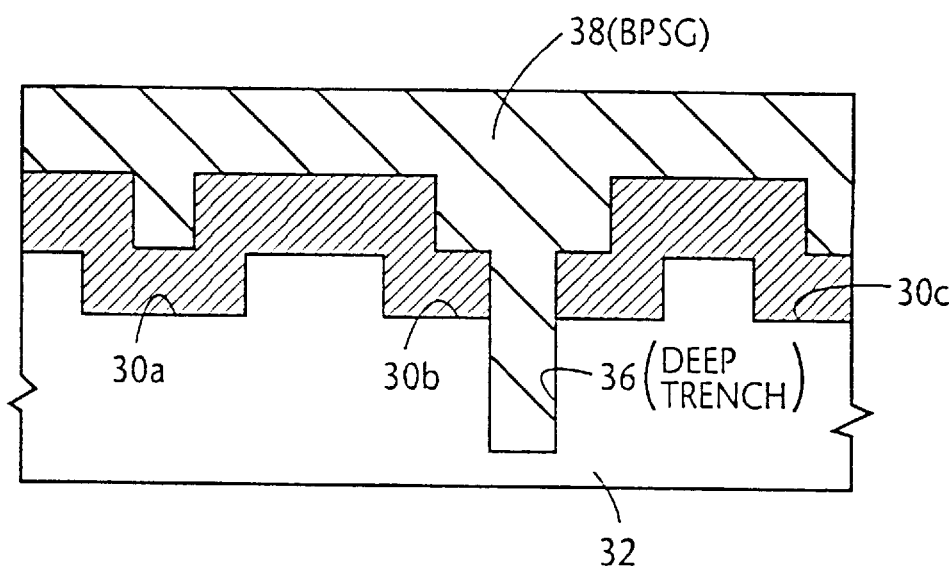
Figure 3C:
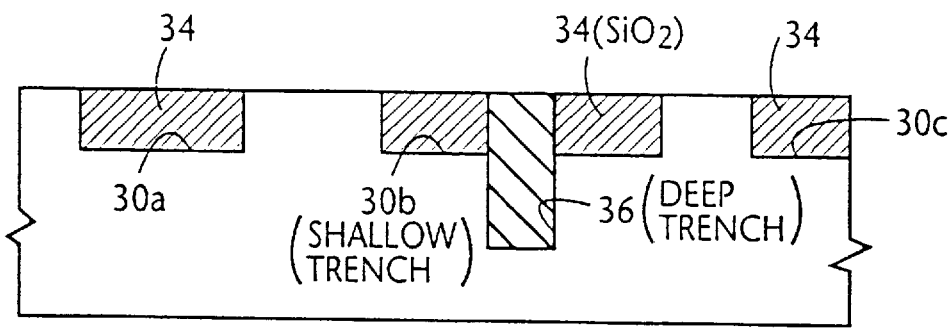

It is to be noted that each of FIGS. 3A–3C shows only three shallow trenches (one is shown in part) and only one deep trench are illustrated for the sake of simplifying the illustration. In practice, a large number of shallow and deep trenches are provided in a large-scale IC.

Referring to FIG. 3A, the process begins with a plurality of shallow trenches 30a–30c being formed on a silicon substrate 32. Each of the shallow trenches has a depth ranging from 0.3 to 0.5 $\mu$m (for example). A silicon oxide ($SiO_2$) film 34 is then grown on the entire surface of the silicon substrate 32 up to a range from 0.6 to 0.8 $\mu$m (for example) using a CVD process.

Following this, as shown in FIG. 3B, a deep trench 36 is formed within the shallow trench 30b in this particular embodiment. Preferably, the deep trench 36 has a width of from 0.5 to 1.0 $\mu$m and a depth of from 3.5 to 5.5 $\mu$m. A BPSG film 38 is then grown up to a range from 0.8 to 1.5 $\mu$m (for example) measured from the top surface of the silicon substrate 32. The BPSG film 38 is flattened using a reflow process at temperature between 850 to 1000° C. Subsequently, the BPSG film 38 and the silicon oxide film 34 on the top surface of the substrate 32 are removed using a chemical/mechanical polishing process, whereby the structure shown in FIG. 3C is obtained.

Since the silicon oxide film 34 contains no impurity, diffusion of impurity into the source, drain and gate regions of a MOS transistor, which is surrounded by the shallow trench, does not occur.

A second embodiment of the present invention will be described with reference to FIGS. 4A–AC, which show a series of fabrication processes of shallow and deep trenches. As in the first embodiment, the shallow and deep trenches are, used to respectively isolate CMOS and bipolar devices (not shown).

The second embodiment differs from the first one in that each deep trench of the second embodiment is covered with a silicon nitride film on the inner walls as well as the bottom thereof. Other than this, the second embodiment is essentially the same as the first embodiment in terms of the structure finally obtained.

Figure 4A:
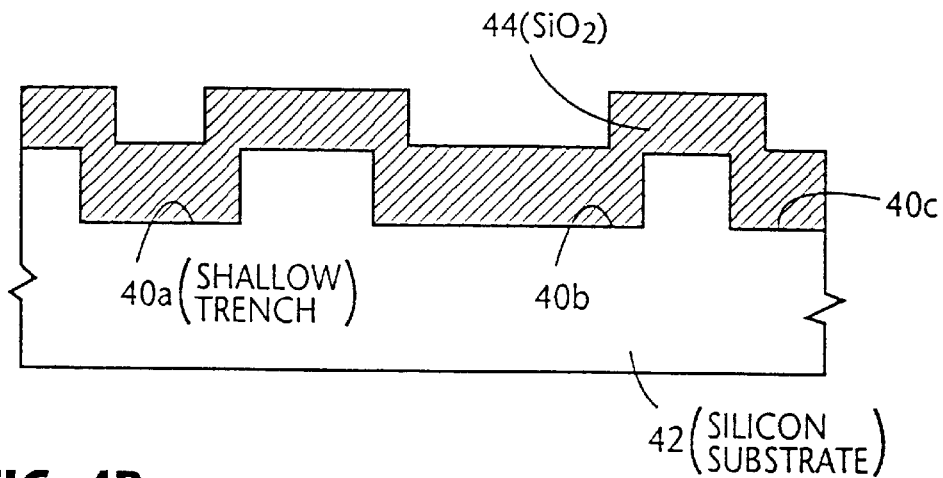
FIGS. 4A through 4C is a schematic cross-section representation of a second, embodiment of the present invention.

Referring to FIG. 4A, the process begins with a plurality of shallow trenches 40a–40c being formed on a silicon substrate 42. Each of the shallow trenches 40a–40c has a depth ranging from 0.3 to 0.5 $\mu$m (for example). A silicon oxide ($SiO_2$) film 44 is then grown, using a CVD process, on the entire surface of the silicon substrate 42 up to a thickness of from 0.6 to 0.8 $\mu$m (for example).

Figure 4B:
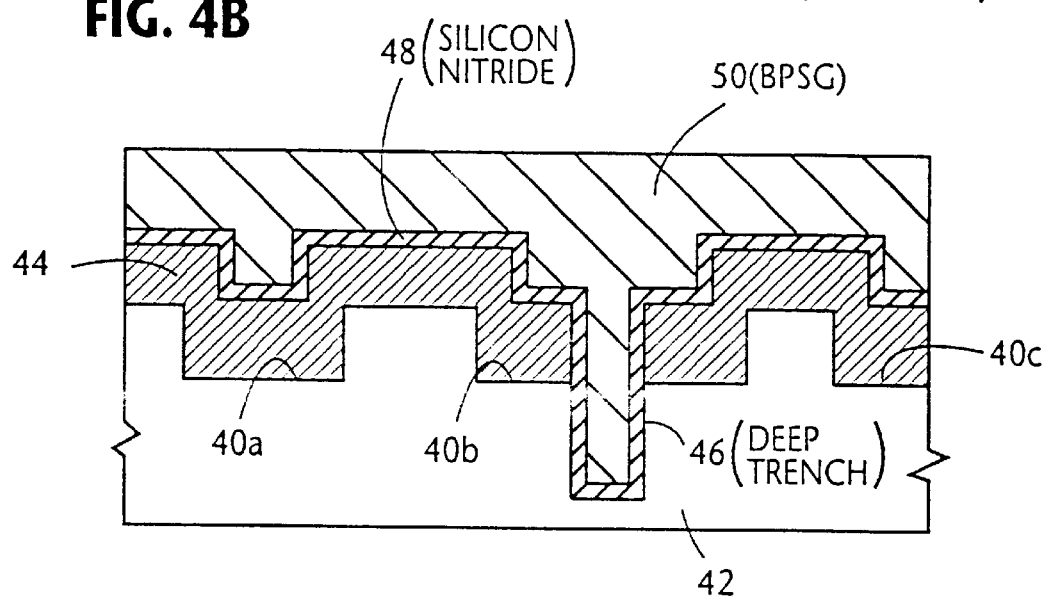
Figure 4C:
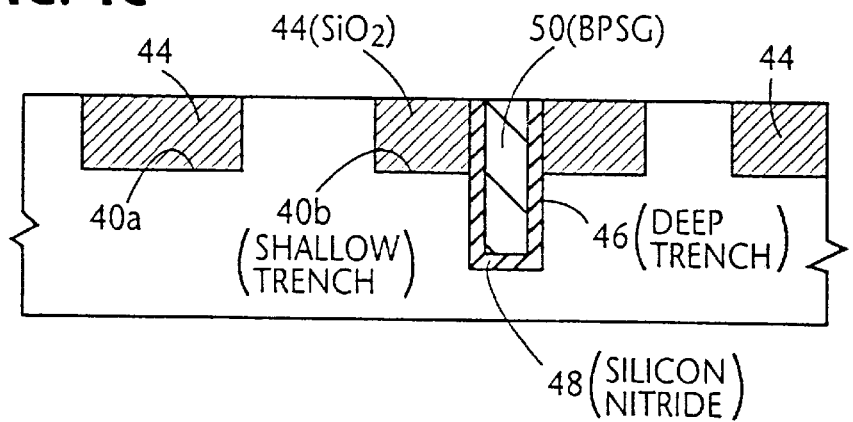

Following this, as shown in FIG. 4B, a deep trench 46 is first formed within the shallow trench 40b in this particular embodiment. Preferably, the deep trench 46 has a width of from 0.5 to 1.0 μm and a depth of from 3.5 to 5.5 μm. A silicon nitride film 48 is then deposited, using a CVD technique, on the surface of the structure after forming the deep trench 46. Subsequently, a BPSG film 50 is grown up to a thickness between 0.8 and 1.5 μm (for example) measured from the top surface of the silicon substrate 42. The BPSG film 50 is then flattened using a reflow process at temperature between 850 to 1000° C. Subsequently, removed are the BPSG film 50, the silicon nitride film 48 except for the film 48 provided in the deep trench 46, and the silicon oxide film 44 on top of the substrate 42. This film removal is carried out using a chemical/mechanical polishing process, whereby the structure shown in FIG. 4C is obtained. The silicon nitride film provided on an inner side of the deep trench 46 serves as a barrier for preventing boron (or phosphorus) from being diffused into the surrounding area. Thus, it is understood that the parasitic capacitance referred to in the opening paragraphs does not develop.

It will be understood that the above disclosure is representative of only two possible embodiments of the present invention and that the concept on which the invention is based is not specifically limited thereto.

What is claimed is:

1. A method of forming a device isolating means on the surface of a semiconductor circuit, comprising the steps of:

(a) forming a plurality of first trenches (40a–40c) on the semiconductor substrate;

(b) depositing a first dielectric film (44) over the semiconductor substrate and in each of said first trenches;

(c) forming a plurality of second trenches (46) within corresponding first trenches through said first dielectric film;

(d) depositing a second dielectric film (48) over said first dielectric film and on an inner surface of each of said second trenches;

(e) depositing a third dielectric film (50) over said second dielectric film and in each of said second trenches;

(f) reflowing said third dielectric film; and (g) removing said first, second and third dielectric films while leaving said first dielectric film in said first trenches and leaving said second and third dielectric films within said second trenches.

2. A method as claimed in claim 1, wherein said first dielectric film is a silicon oxide film containing no impurity and wherein said second dielectric film is a silicon nitride film while said third dielectric film is a silicon oxide film containing phosphorous and boron.

\* \* \* \* \*